(12) United States Patent
Penniman

(10) Patent No.: US 8,885,272 B2
(45) Date of Patent: Nov. 11, 2014

(54) FLEXIBLE MEMBRANE AND LENS ASSEMBLY AND ASSOCIATED METHOD OF LENS REPLICATION

(75) Inventor: Edwin E. Penniman, Boulder, CO (US)

(73) Assignee: OmniVision Technologies, Inc., Santa Clara, CA (US)

( * ) Notice: Subject to any disclaimer, the term of this patent is extended or adjusted under 35 U.S.C. 154(b) by 386 days.

(21) Appl. No.: 13/100,039

(22) Filed: May 3, 2011

(65) Prior Publication Data

US 2012/0281302 A1    Nov. 8, 2012

(51) Int. Cl.
G02B 7/02 (2006.01)
G02B 3/12 (2006.01)
G02B 1/06 (2006.01)
H01L 27/146 (2006.01)
G02B 7/04 (2006.01)
G02B 13/00 (2006.01)
G02B 7/08 (2006.01)
G03B 3/10 (2006.01)

(52) U.S. Cl.
CPC ............ *G02B 7/08* (2013.01); *H01L 27/14625* (2013.01); *G02B 7/04* (2013.01); *H01L 27/14618* (2013.01); *G02B 13/0085* (2013.01); *G03B 3/10* (2013.01)
USPC .......................................... 359/824; 359/666

(58) Field of Classification Search
CPC ....... G02B 5/201; G02B 3/14; G03F 7/70958
USPC ................. 359/319, 847, 824, 280, 618–626, 359/618–62, 666
See application file for complete search history.

(56) References Cited

U.S. PATENT DOCUMENTS

| | | | |
|---|---|---|---|
| 4,154,506 A | 5/1979 | Yevick | |
| 4,194,811 A | 3/1980 | Barry | |
| 6,124,974 A | 9/2000 | Burger | |
| 6,178,033 B1 | 1/2001 | Ford et al. | |
| 6,381,072 B1 | 4/2002 | Burger | |
| 6,417,432 B1 | 7/2002 | Downing | |
| 6,636,653 B2 * | 10/2003 | Miracky et al. | 385/14 |
| 6,738,199 B2 * | 5/2004 | Nishioka | 359/726 |
| 7,374,301 B1 | 5/2008 | Simmers | |

(Continued)

FOREIGN PATENT DOCUMENTS

| | | |
|---|---|---|
| EP | 0550022 A | 7/1993 |
| EP | 1251365 A1 | 10/2002 |

(Continued)

OTHER PUBLICATIONS

International Search Report and Written Opinion issued in PCT Application PCT/US2009/031283, dated Apr. 30, 2009, 16 pages.

(Continued)

*Primary Examiner* — Alicia M Harrington
(74) *Attorney, Agent, or Firm* — Lathrop & Gage LLP

(57) ABSTRACT

A membrane and lens assembly includes a flexible membrane mounted with a supporting structure, such as a plurality of spacers, a frame, a ring, a plate or a surface plate. At least one first lens mounts with a first side of the membrane. At least one actuator varies a characteristic of the membrane, such as membrane shape, position or tautness, to reposition the lens. In a related method of lens replication, a flexible membrane is attached to a ring and stretched with the ring. Lenses are replicated on one or both sides of the stretched membrane.

16 Claims, 11 Drawing Sheets

(56) References Cited

U.S. PATENT DOCUMENTS

| | | |
|---|---|---|
| 7,436,608 B2 | 10/2008 | Chuang |
| 7,663,083 B2 | 2/2010 | Kwon et al. |
| 7,920,343 B2 * | 4/2011 | Lake et al. .................... 359/619 |
| 7,925,154 B2 | 4/2011 | Ryu |
| 2005/0035474 A1 | 2/2005 | Itoh |
| 2005/0275946 A1 | 12/2005 | Choo et al. |
| 2006/0186492 A1 | 8/2006 | Boettiger et al. |
| 2007/0065131 A1 | 3/2007 | Wei et al. |
| 2007/0171549 A1 | 7/2007 | Chuang et al. |
| 2008/0054155 A1 | 3/2008 | Klein |
| 2009/0046144 A1 | 2/2009 | Tuttle |
| 2010/0165134 A1 | 7/2010 | Dowski, Jr. et al. |
| 2010/0232161 A1 | 9/2010 | Aschwanden |

FOREIGN PATENT DOCUMENTS

| | | |
|---|---|---|
| EP | 1443754 A2 | 8/2004 |
| EP | 1837168 A1 | 9/2007 |
| EP | 2239600 A1 | 10/2010 |
| JP | 2005294347 A | 1/2001 |
| WO | 0233469 A | 4/2002 |
| WO | 2008020899 A2 | 2/2008 |
| WO | 2009092000 A2 | 7/2009 |

OTHER PUBLICATIONS

Select File History from U.S. Appl. No. 12/863,416 dated Feb. 28, 2011 and Mar. 4, 2013, 72 pages.

Select File History from European Application No. 09702508.4 dated Aug. 12, 2013 through Feb. 15, 2013, 49 pages.

Office Action in Chinese Application 200980107784.5 dated Jan. 5, 2013, 13 pages.

Office Action in Chinese Application 200980107784.5 dated Apr. 12, 2012, 12 pages.

Response to Office Action in Chinese Application 200980107784.5 dated Aug. 27, 2012, 14 pages.

Office Action in Chinese Application 201210135641.9, dated May 27, 2014, 12 pages.

* cited by examiner

FLEXIBLE MEMBRANE AND LENS ASSEMBLY AND ASSOCIATED METHOD OF LENS REPLICATION

TECHNICAL FIELD

This disclosure relates generally to support structures for lenses, and in particular but not exclusively, relates to substrate structures for wafer level optical lenses.

BACKGROUND

Mobile phones, PDAs, laptop computers and other electronic devices often contain imaging devices such as wafer level cameras. Wafer level cameras typically include a lens assembly of several stacked lenses, and an underlying image sensor. Wafer level cameras are manufactured by wafer level packaging technologies that include processes such as replicating lenses on wafers, aligning wafers, dicing, and finally packaging individual camera modules.

An opto-wafer, or lens plate, contains a multitude of small individual lenses that are fabricated onto a substrate. Typically, the substrate is relatively inflexible, is not stretchable, may be too thick for certain lens designs, and is prone to breakage.

SUMMARY

This disclosure teaches using certain materials so that a lens substrate may possess desirable characteristics, including minimized thickness, flexibility and/or stretchability.

In one embodiment, a membrane and lens assembly includes a flexible membrane mounted with a supporting structure. At least one first lens mounts with a first side of the membrane. At least one actuator varies one or both of membrane tautness and position, to reposition the lens.

In one embodiment, a membrane and lens assembly includes a flexible membrane mounted with a supporting structure, and at least one first lens mounted with a first side of the membrane. One or both of the lens and the membrane includes a piezoelectric element. An actuator induces a piezoelectric effect in one or both of the lens and the membrane, to vary one or more of membrane position, lens position, membrane tautness, membrane shape and lens shape, to adjust focus of the lens.

In one embodiment, a membrane and lens assembly includes a plurality of supporting magnetic spacers, a flexible membrane mounted with the spacers, a lens mounted with the membrane, and at least one current-carrying coil. Electric current through the coil generates a magnetic field for interacting with the magnetic spacers to vary one or more membrane properties, to adjust focus of the lens.

In one embodiment, a membrane and lens assembly includes a flexible membrane mounted with a supporting structure, a lens mounted with the membrane, and a pair of plates capable of retaining electric charges and proximate the membrane. Applying a voltage between the plates generates an electrostatic field for repositioning the membrane to adjust focus of the lens.

In one embodiment, a method of lens replication includes attaching a flexible membrane to a ring, stretching the membrane with the ring, and replicating lenses on one or both sides of the stretched membrane.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Figure 1A:
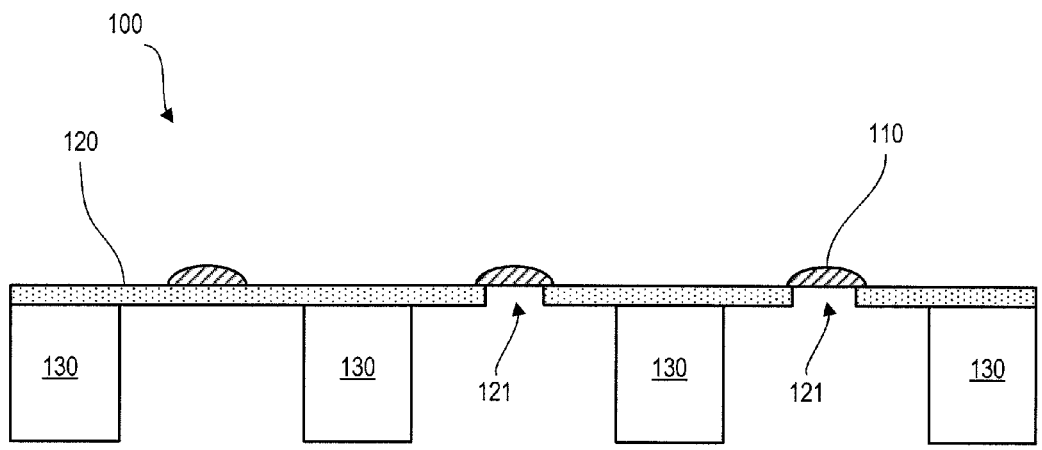
FIG. 1A is a cross sectional view of a membrane and lens assembly including a spacer-supported membrane with lenses attached to one side, according to an embodiment.

In the following description, numerous details are set forth to provide a thorough understanding of the present invention. One skilled in the relevant art will recognize, however, that the techniques described herein can be practiced without one or more of the specific details, or with other methods, components, materials, etc.

It will be appreciated that the phrases "in one embodiment" or "in an embodiment" throughout this disclosure do not necessarily all refer to the same embodiment. Furthermore, the particular features, structures, or characteristics described herein may be combined in any suitable manner in one or more embodiments. It will also be appreciated that for the sake of clarity, well-known structures, materials or operations may not be shown in the drawings or described herein.

A lens substrate of an opto-wafer or lens plate may be formed of one or more membrane substances. Using a membranous substrate results in a relatively thin overall lens profile (e.g., as compared to a glass substrate), may also reduce the cost of the lens plate and may also enable lens repositioning for focus adjustment of lenses mounted or configured with the membrane, passive wafer alignment and larger overall substrates. Varying a characteristic of the membrane—such as membrane position, membrane tautness or membrane shape—in turn varies lens position to facilitate focusing (e.g., relative to a focal plane) and/or a lens function (e.g., zooming or phase modulation).

As shown in FIG. 1A, a membrane and lens assembly 100 includes one or more lenses 110 cast or otherwise replicated onto a membrane 120, which is supported in various places by spacers 130. Hereinafter, the term "lens group" is used to refer to one lens or a plurality of lenses.

Figure 1B:
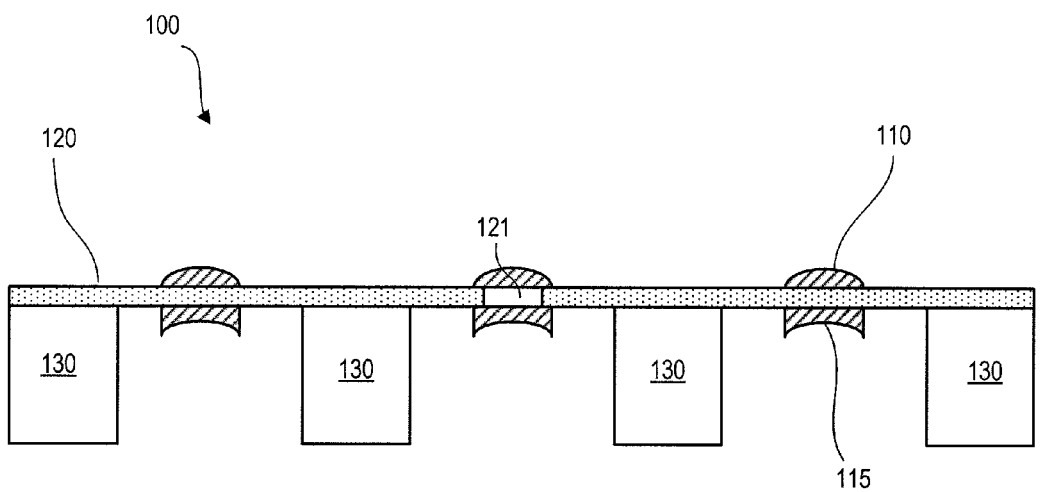
FIG. 1B is a cross sectional view of a membrane and lens assembly including a spacer-supported membrane with lenses attached to both sides, according to an embodiment.

Membrane 120 may be made from a variety of materials, including metal film (such as steel shim stock), plastics (such as Mylar or nylon), more flexible materials (such as rubber), piezoelectric materials, or combinations thereof. Membrane 120 is preferably flexible, stretchable and durable, such that it is relatively difficult to break. For example, membrane 120 is more flexible, elastic and durable than glass, which is a widely used lens substrate in conventional wafer level packaging of opto-wafers. Apertures may be inexpensively and/or accurately formed through membrane 120 at various positions. For example, apertures (such as aperture 121) may be machined, etched, or laser cut in membrane 120. In one aspect, apertures 121 are located above or beneath centers of a lens group 110 to permit light transmission therethrough. In another aspect, apertures 121 may not be required if light sufficiently transmits through membrane 120. Lens group 110 may be cast or otherwise replicated on one side of membrane 120, which may be supported by spacers (as shown in FIG. 1A) or by a frame, ring, plate or surface plate (not shown) in manners similar to those described herein below with respect to membranes having lens groups on both sides. Optionally, lenses may be positioned with both sides of membrane and lens assembly 100, as illustrated in FIG. 1B. In particular, FIG. 1B shows lens groups 110 and 115 situated on opposite sides of membrane 120.

Figure 2A:
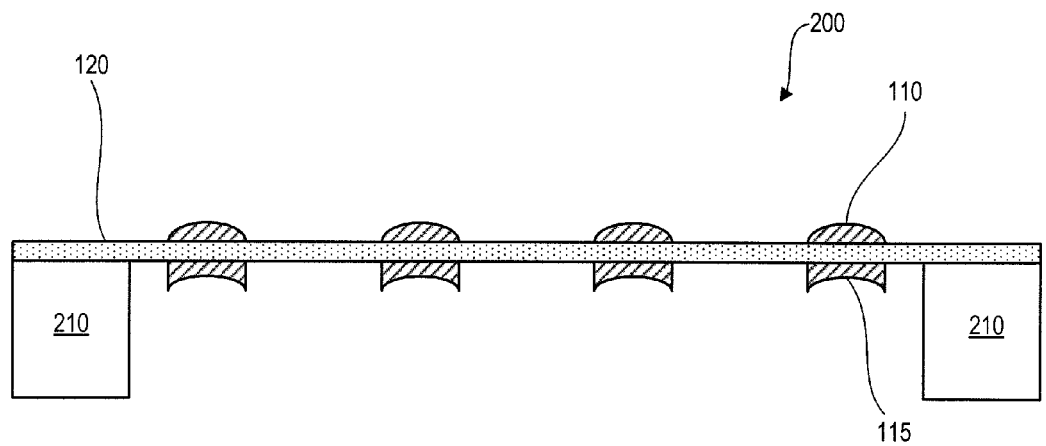
FIG. 2A is a cross sectional view of a membrane and lens assembly having a plurality of lenses attached to a membrane that is stretched by and bonded to a ring, according to an embodiment.

As shown with respect to membrane and lens assembly 200 of FIG. 2A, membrane 120 may be stretched and bonded to a flat ring 210, rather than mounted with spacers, to form a relatively flat and stable substrate for lens groups 110 and 115. Lens groups 110 and 115 are for example cast or otherwise replicated onto opposing sides of membrane 120. Optionally, membrane 120 supports lenses on only one side (i.e., lens group 110 or lens group 115). The material forming membrane 120 may be chosen to achieve a particular working relationship with ring 210 materials, in order to achieve a desirable goal. In one example, the effective coefficient of thermal expansion of membrane 120 may be the same as, or similar to, that of ring 210. This may in part allow the process of replicating or casting lens group 110 and/or 115 onto membrane 120 to be relatively insensitive to thermal expansion mismatch. In another example, described further below, ring 210 has a greater coefficient of thermal expansion than membrane 120, such that membrane 120 stretches when it is mounted with ring 210 and ring 210 is heated.

Ring 210 may be reusable, and may include kinematic locating features in order to increase efficiency of the lens replication and/or casting process. For example, ring 210 may include fiducial features to assist alignment between a lens mold and membrane 120, or between membrane 120 and other substrates (such as another membrane). By using a relatively flexible and/or stretchable membrane 120, lens assemblies may be created by means other than conventional dicing and square array methods. For example, a laser cutting or die cutting method may be used. Also, in part due to the flexibility, stretchability and other characteristics of membrane 120, lens dies/assemblies may be more densely packed than is possible with a square array (for example, where the lens assembly is hexagonal in shape).

Figure 2B:
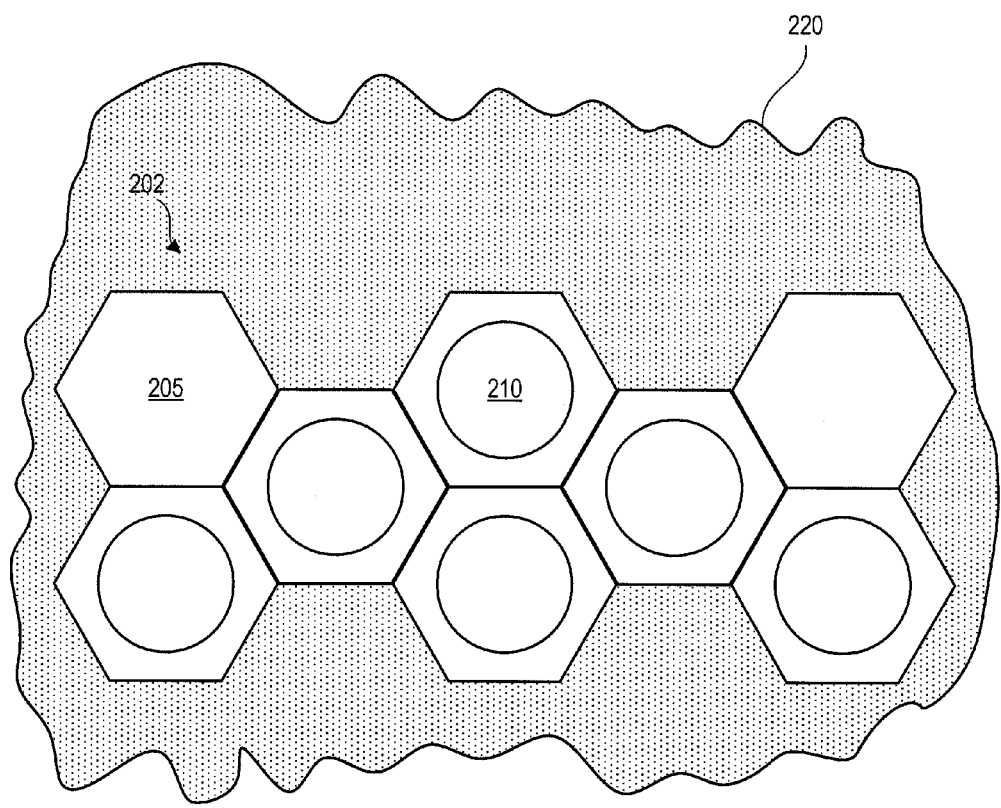
FIG. 2B is a planar view of a membrane having an array of hexagonal sections, several of which contain lenses, according to an embodiment.

In one aspect, shown in FIG. 2B, a hexagonal array 202 including a plurality of hexagonal sections 205 (several of which contain lens groups 210) is constructed on a membrane 220. Hexagonal sections 205 may be cut from a wafer array by means such as laser cutting. In one aspect, membrane 220 is stretched upon a spacer wafer. Lenses of a lens group 210 are bonded together with membrane 220 to form a hexagonal section 205. Hexagonal sections 205, each with its own individual spacer, are die cut or laser cut from the membrane 220/spacer wafer, such that membrane singulation follows spacer singulation. In another aspect, membrane 220 is first cut into hexagonal sections 205 (e.g., with lens groups 210) and each section 205 is then mounted with an individual spacer piece or module. Membrane sections 205 may be laser cut (for example, into hexagonal sections) or die cut from membrane 220. Hexagonal sections 205 may beneficially fit better with circular housing or camera components than traditional, square-cut lens assemblies. It will be appreciated that sections 205 (and any associated lens groups/spacers) may be cut into shapes other than hexagons, such as circular, octagonal, square or other shapes.

Figure 3A:
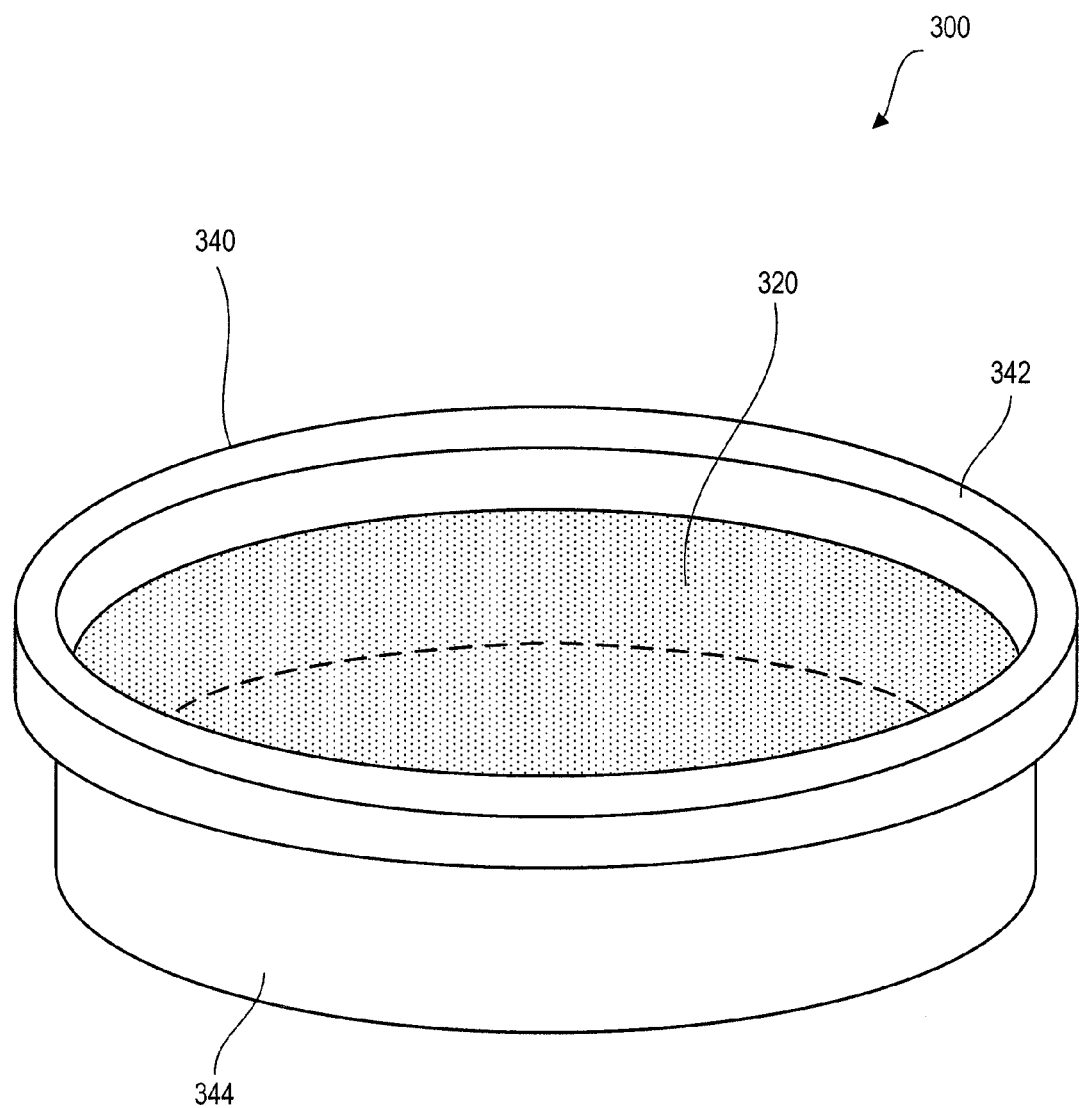
FIG. 3A is a perspective view of a membrane and lens assembly including a membrane stretched by a ring, according to an embodiment.
Figure 3B:
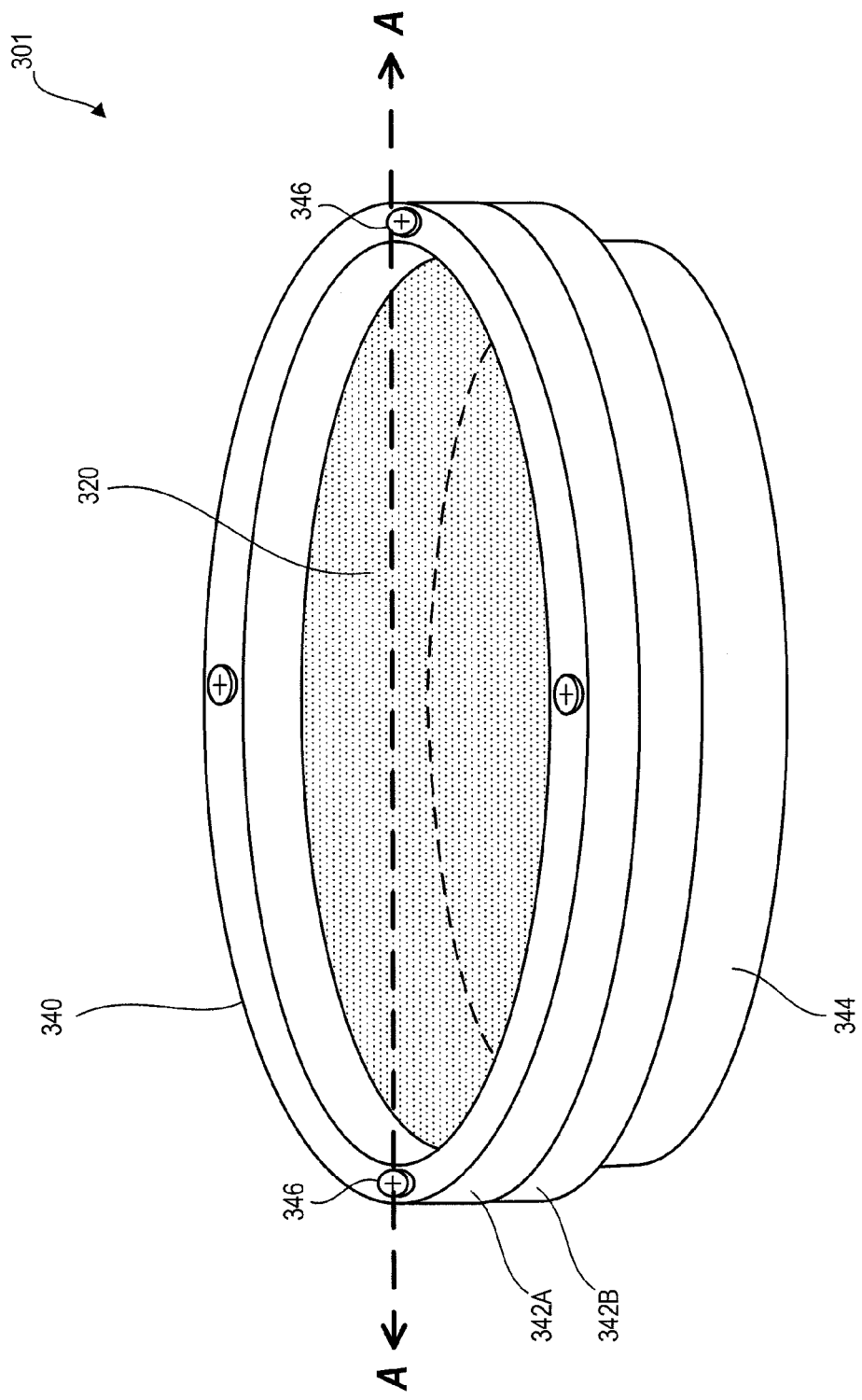
FIG. 3B is a perspective view of a membrane and lens assembly similar to that shown in FIG. 3A, but having dual outer ring elements, according to an embodiment.
Figure 3C:
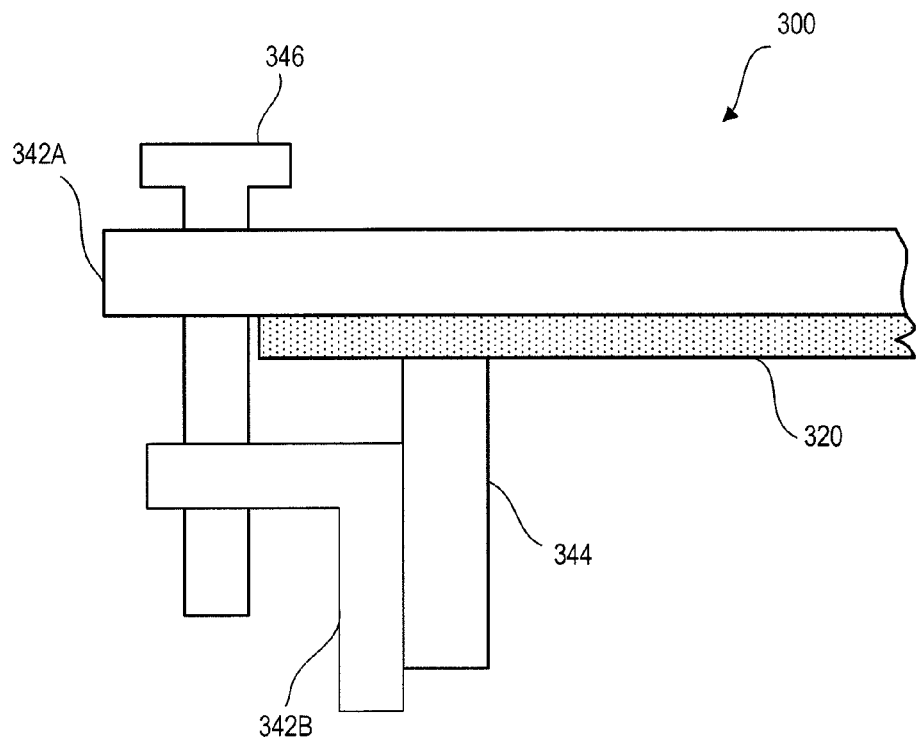
FIG. 3C is a partial, cross sectional view showing additional detail of the assembly of FIG. 3B.

To serve as a substrate for lenses, a membrane may be simply glued to a spacer wafer without being stretched, but the membrane may also be stretched prior to gluing, and/or stretched by a ring to provide a relatively flat and rigid substrate. FIG. 3A is a perspective view of a membrane and lens assembly 300 with a membrane 320 attached to and stretched by a ring 340. One or more lenses/lens groups (not shown) mount with one or both sides of membrane 320. Ring 340 includes one outer ring element 342 and one inner ring element 344. FIG. 3B is a perspective view of a membrane and lens assembly 301 showing membrane 320 attached to and stretched by a ring 340 that has dual outer ring elements 342A and 342B. See also FIG. 3E for additional detail and/or optional appearance of outer ring elements 342A and 342B. FIG. 3C is a partial cross sectional view along line A-A of FIG. 3B, showing additional detail of ring 340 and exemplary attachment of membrane 320 with ring 340. For purposes of the following discussion, FIGS. 3B and 3C are best viewed together. As shown in FIGS. 3B and 3C, bolts 346 attach ring elements 342 and 344. More or fewer bolts 346 than illustrated may be used, without departing from the scope hereof.

Membrane 320 is shown attached to an upper, outer ring element 342A in FIG. 3C. Membrane 320 may be glued to ring element 342A; optionally, membrane 320 attaches with lower ring element 342B and/or with inner ring element 344. In one aspect, inner ring element 344 provides structural support for stretching membrane 320 over/under and securing membrane 320 with outer ring element(s) 342. Bolts 346 may connect outer ring element(s) 342 with inner ring element 344, or may connect several outer ring elements 342 together without securing elements 342 with inner ring element 344 (see FIG. 3C). It will be appreciated that outer ring elements 342A and 342B need not be spaced as shown in FIG. 3C, but may be closer together (e.g., to pinch and hold, or enhance hold of, membrane 320) or farther apart, without departing from the scope hereof.

One or more of ring elements 342/344 may be displaced or distorted to enhance stretching of membrane 320. For example, tightening bolts 346 may force an outer ring element 342 (e.g., outer ring element 342A, FIGS. 3B and 3C) to bend downward (e.g., towards outer ring element 342B), thereby tightening and stretching attached membrane 320. In such case, bolts 346 may collectively or individually serve as an actuator for varying a membrane characteristic (e.g., membrane position, shape or tautness). Membrane 320 is stretched to a desired evenness and tension level, which may be ascertained and monitored using a tension meter. For example, a tension meter, such as the drum tension meter used to gauge musical percussion instruments, measures the tension level and evenness of membrane 320.

Alternative structures or processes may be used to bond and stretch membrane 320. In one aspect, a ring element 342 attached with membrane 320 has a higher coefficient of thermal expansion than membrane 320. Membrane 320 is glued or otherwise bonded to ring element 342, and ring 340 and attached membrane 320 are subsequently heated. Due to its higher coefficient of thermal expansion, ring element 342 expands more than membrane 320, thereby stretching attached membrane 320. In such embodiment, ring element 342 itself (when heated) actuates membrane 320 to alter one or more membrane characteristics.

Figure 3D:
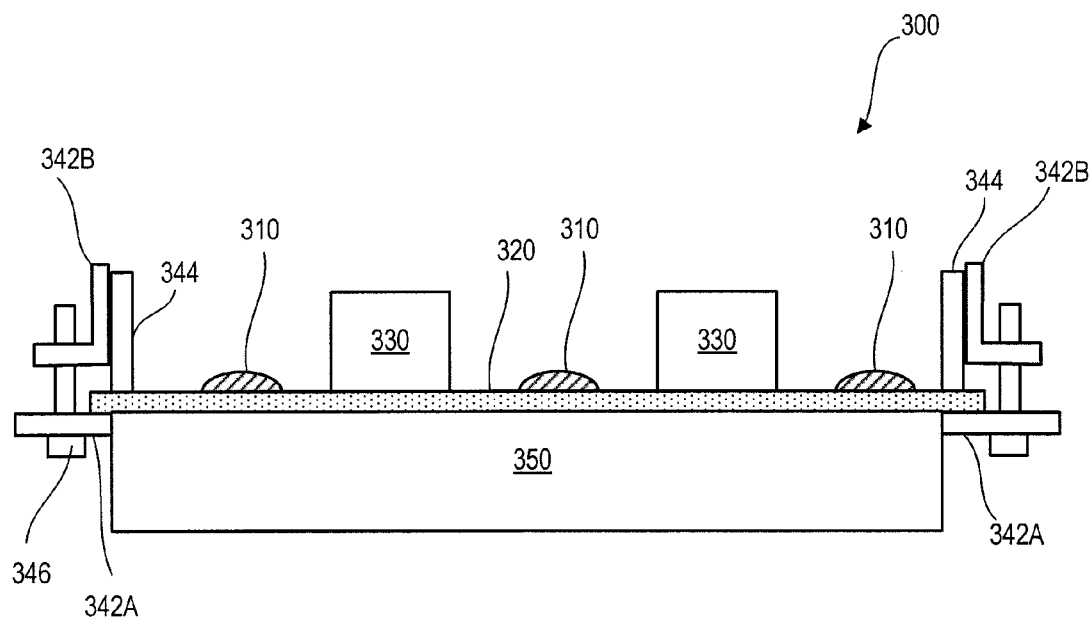
FIG. 3D is a full cross sectional view of the assembly of FIG. 3C with an additional flat surface plate supporting the membrane, and with a plurality of lenses separated by spacer wafers mounted with the membrane, according to an embodiment.

FIG. 3D is a cross sectional view showing additional structures mounted with stretched membrane 320. As shown, membrane 320 is mounted with ring 340 as shown in FIG. 3C, and turned over upon a flat surface plate 350, which provides additional support to membrane 320. Spacer wafers 330 are applied to and bonded with membrane 320 opposite surface plate 350, for example using an adhesive. One or more lens groups 310 (three shown) are cast or otherwise replicated onto stretched membrane 320. One or more portions of membrane 320 containing a lens group 310 may be cut from membrane 320 (and therefore from ring 340), e.g., using a laser. Die cutting may optionally be used to singulate membrane/lens groups.

Figure 3E:
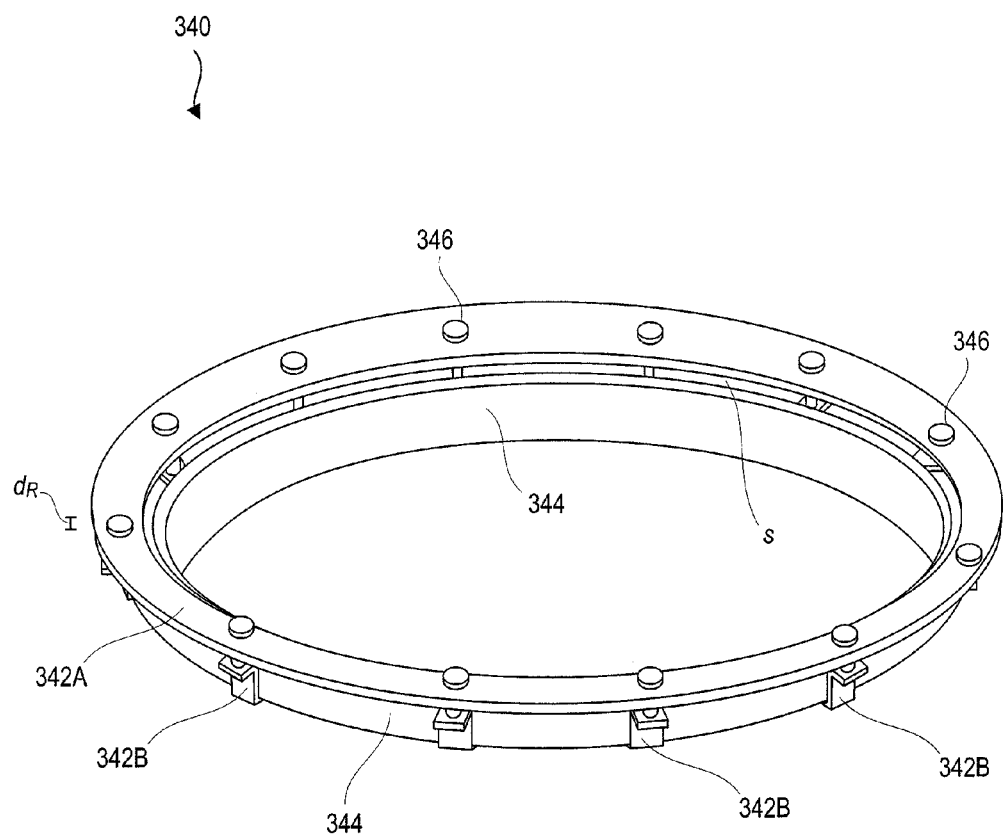
FIG. 3E is a perspective view of an embodiment of the ring of the FIG. 3B membrane.

FIG. 3E is a perspective view of ring 340, showing additional ring detail and refined appearance of upper and lower outer ring elements 342A and 342B. As shown, outer ring element 342A fits above and proximate inner ring element 344, with bolts 346 securing ring element 342 with a plurality of lower, outer ring elements 342B that are circumferentially arranged about an outer wall of inner ring element 344. It will be appreciated that lower, outer ring elements 342B may be formed with inner ring element 344, or retrofitted to an existing inner ring element 344.

A membrane, such as membrane 320 (FIG. 3D), is for example affixed with a bottom surface of upper, outer ring element 342A such that the membrane occupies a space s between ring elements 342A and 344, when the membrane is assembled with ring 340. Tightening bolts 346 decreases an inter-ring distance $d_R$ between ring elements 342A and 342B (and therefore between elements 342A and 344) to adjust tension on the membrane.

Figure 4:
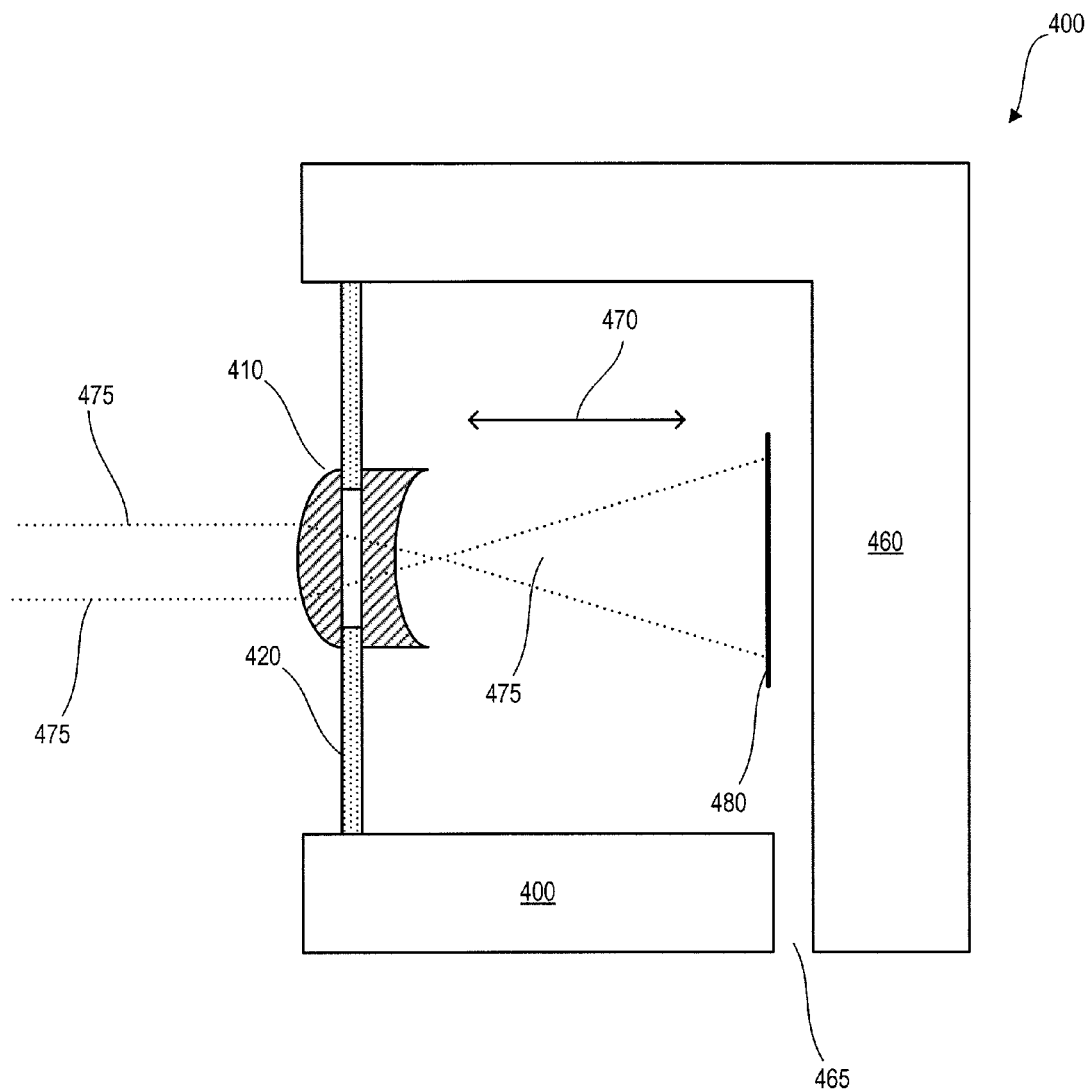
FIG. 4 is a cross sectional view of a membrane and lens assembly including a lens membrane and supportive frame, showing axial displacement of the membrane for focus adjustment of a lens mounted therewith, according to an embodiment.

FIG. 4 is a cross sectional view of a membrane and lens assembly 400 showing a lens group 410 (having one or more lenses) formed on a flexible membrane 420, which is attached to a frame 460 that forms an opening 465. Lens group 410 may be relatively stable in one or several directions. For example, lens group 410 may be relatively stable in any lateral direction along the plane of membrane 420, but may be axially displaced as indicated by directional arrow 470. Lens group 410 may also be relatively stable in any direction at an angle between the plane of membrane 420 and (but not including) the axial plane. Axial movement permits focus adjustment of lens group 410 and may facilitate other lens functions, such as zooming and phase modulation. Adjusting axial position of membrane 420 with respect to frame 460 thus adjusts focus of light 475 by lens group 410, relative to a focal plane 480, where an image sensor may be located. By way of example, an approximately 15 micrometer axial displacement of lens group 410 may bring the focus of lens group 410 from infinity to approximately 10 centimeters. Opening 465 may serve a variety of functions, for example, allowing barometric equalization or dampening of membrane 420.

Figure 5A:
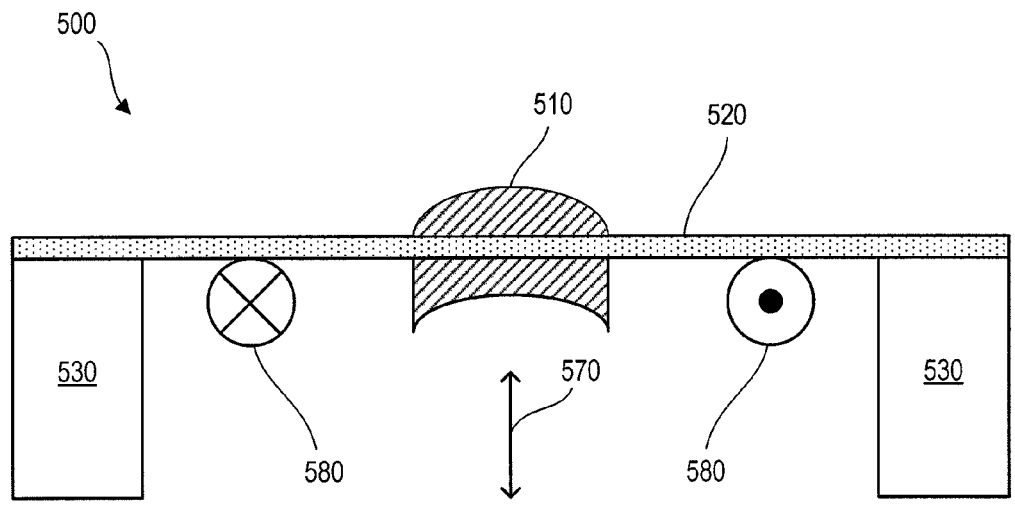
FIG. 5A is a cross sectional view of a membrane and lens assembly including a lens membrane activated by interactions between an associated coil and magnetic spacers, according to an embodiment.

In one embodiment, an electromagnetic field may be used to generate the motive force to reposition lens group 410. FIG. 5A shows a membrane and lens assembly 500 having a lens/lens group 510 supported by one or both sides of a membrane 520, which is in turn supported by spacers 530. A lens coil 580 (which may be similar to a voice coil) is attached to or otherwise associated with membrane 520 and/or lens group 510. Spacers 530 may have magnetic properties. For example, spacers 530 may be ferromagnetic, or otherwise be or behave like permanent magnets. Passing an electric current through lens coil 580 generates an electromagnetic field that interacts with magnetic spacers 530. This interaction provides a motive force to vary a membrane characteristic. In one aspect, the motive force repositions membrane 520 (e.g., moving membrane 520 up or down, as indicated by directional arrow 570), thereby adjusting focus of or otherwise affecting function of lens or lens group 510. That is, lens coil 580 acts as an actuator to reposition membrane 520 and lens group 510. Such repositioning for example adjusts focus and/or phase modulation of assembly 500/lens group 510. In FIG. 5A, lens coil 580 carries a clockwise directional current (e.g., when viewed from the top of membrane 520). Alternatively, lens coil 580 carries a counterclockwise current.

Figure 5B:
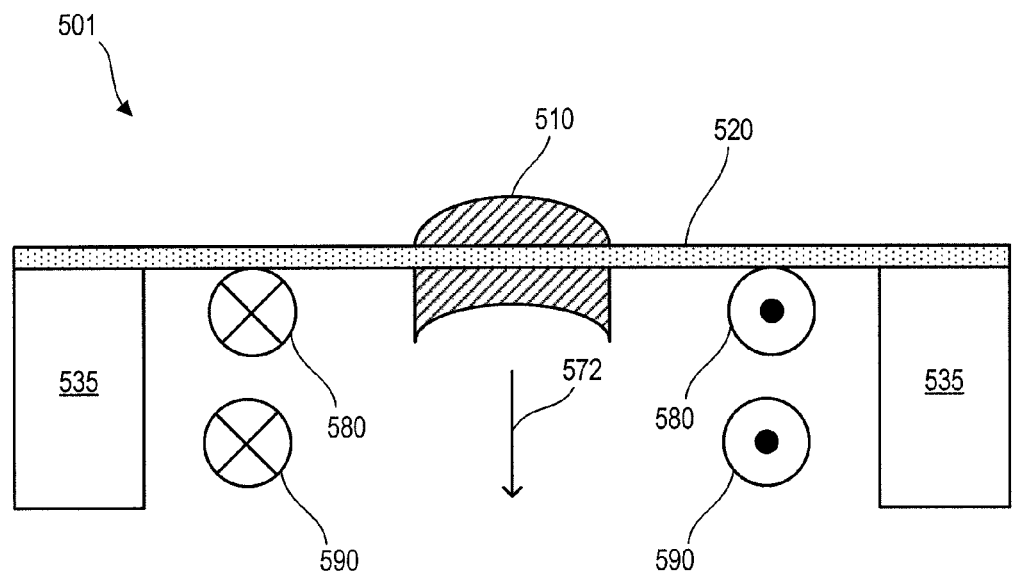
FIG. 5B is a cross sectional view of a membrane and lens assembly including a lens membrane supported by spacers and activated by interactions between associated dual coils, according to an embodiment.

FIG. 5B is a cross sectional view showing alternative actuation of lens/lens group 510. Here, a membrane and lens assembly 501 includes a pair of spacers 535 that may or may not have long term magnetism. In one aspect, as an alternative to magnetic or electromagnetic spacers 535, an optional coil 590 is in proximity to lens coil 580. A current passing through coil 590 generates an electromagnetic field, which interacts with the electromagnetic field generated by the current in lens coil 580. As shown in FIG. 5B, both the current of lens coil 580 and the current of optional coil 590 are clockwise directional currents (when viewed from the top of membrane 520). The resulting motive force varies one or more of membrane tautness, shape and position, for example, moving membrane 520 and lens group 510 in a downward direction, as indicated by directional arrow 572. Alternatively, if the two currents are in opposite directions, membrane 520 and lens group 510 are moved upwards. That is, the combination of lens coil 580 and optional coil 590 acts as an actuator to reposition membrane 520 and lens group 510. Lens coil 580 and optional coil 590 may be produced by various processes, including a photolithography process producing coils 580 and/or 590 containing wires having a thickness of approximately 25 micrometers.

Various mathematical models may be used to design coils 580 and/or 590 as disclosed above. For example, an arrangement of two current-carrying coils in close proximity to each other may be modeled as two parallel, current-carrying wires. Currents $I_1$ and $I_2$ of the coils or wires generate electromagnetic fields that interact with each other, resulting in a motive force F according to:

$$F = \frac{\mu I_1 I_2}{2\pi a} L \qquad \text{Eq. 1}$$

where μ is the magnetic constant (equal to about 1.257×10$^{-6}$N/A$^2$ for vacuum, air and most other gases, but known to vary from this value for other materials), a is the distance between the two coils carrying the currents I$_1$ and I$_2$, and L is the length of the wires. For example, if two coils each having a radius of 1 millimeter (and thus effective lengths of 3.14 mm) are separated by a distance of 100 micrometers across intervening air, then an effective current of 1 ampere in each coil will result in a 12.6 micro-Newton force. If the two currents have the same direction, then the force is attractive. If the two currents have opposite directions, then the force is repellent. In an example wherein each coil contains five to ten loops, if each coil carries an effective current of 2 amperes, then the resulting interacting force is 50.3 micro-Newtons.

An electrostatic field may also be used to generate a motive force to reposition a lens (e.g., by varying membrane tautness, shape and/or position). In an embodiment illustrated by FIG. 6, a membrane and lens assembly 600 includes a lens/lens group 610 supported by a membrane 620, which is in turn supported by spacers 630. An upper plate 692 attaches or is otherwise associated with membrane 620 and/or lens group 610. A lower plate 694 is situated in proximity to upper plate 692. For example, lower plate 694 may be situated substantially beneath upper plate 692. Upper plate 692 and lower plate 694 may have conductive properties, such that applying a voltage between upper and lower plates 692 and 694 results in electrostatic fields that produce a motive force to move membrane 620 and lens group 610 upwards or downwards, as indicated by arrow 670. That is, the combination of upper plate 692 and lower plate 694 acts as an actuator to reposition membrane 620 and lens group 610. Electrostatic repositioning may for example be used to auto focus a lens relative to a focal plane.

A motive force for repositioning a membrane/lens may be otherwise effected. In one aspect, lens group 610, membrane 620, plates 692 and 694 and spacers 630 are made with materials that retain electric charges, such as electrets. Optionally, one or several, but not all of lens group 610, membrane 620, plates 692 and 694 and spacers 630 are electrets. Electric charges may generate electrostatic fields between plates 692 and 694 to produce a motive force for moving membrane 620/lens group 610.

Figure 6:
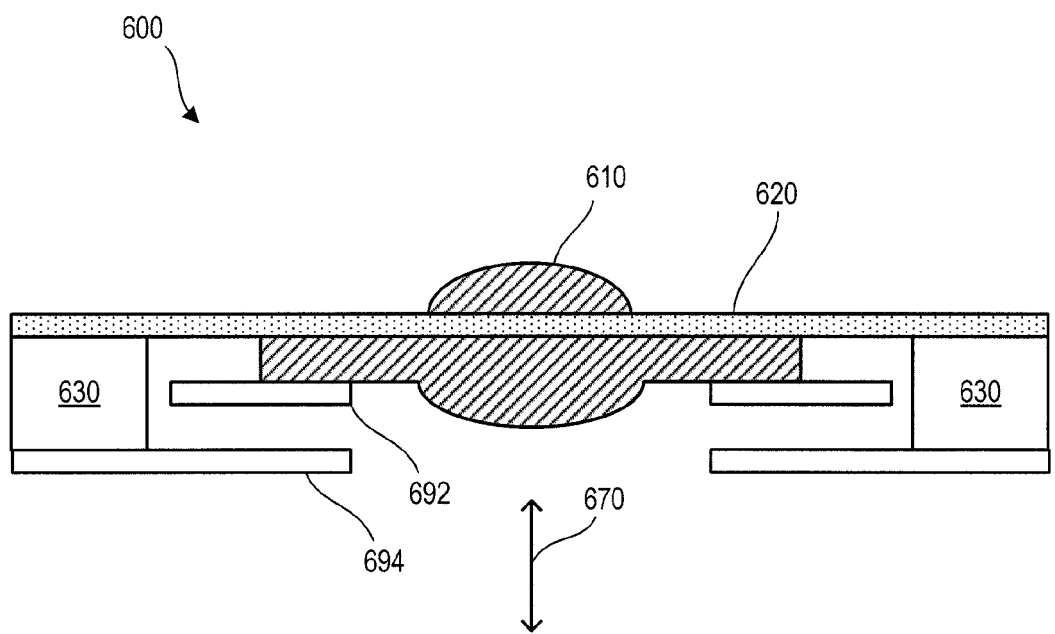
FIG. 6 is a cross sectional view of a membrane and lens assembly including a lens mounted with a spacer-supported membrane, and illustrating lens repositioning through an electrostatic field effect realized by applying a voltage between upper and lower plates proximate the lens membrane, according to an embodiment.

Various mathematical models may be used in designing components shown in FIG. 6 and described above. For example, a force F generated between two charged plates may be calculated according to:

$$F = \frac{\varepsilon A V^2}{2d^2} \qquad \text{Eq. 2}$$

where ε is the electric constant (equal to about 8.854×10$^{-12}$ A·s/(V·m) for vacuum, air and most other gases, but known to vary from this value for other materials), A is an electrified area of the plates (which is approximately equal for both plates), V is an electrical potential between the plates, and d is a distance between the two plates. By way of example, if two charged plates (i.e., plates 692 and 694) each have an area of 2.2 square millimeters, with an inter-plate distance of 0.05 millimeters, then a potential of 20 volts will produce a force of 3.4 micro-Newtons between the plates. If the plate charges have opposite signs, then the inter-plate force is attractive. If the plate charges have the same signs, the force is repellent. An attractive inter-plate force for example pulls membrane 620 down, whereas a repellant force pushes membrane 620 upwards, away from plate 694.

As disclosed above, lens-membrane repositioning may be achieved by generating electromagnetic or electrostatic fields. Using permanent magnets (for example, as spacers 530) may result in stronger electromagnetic fields, allowing designs that include relatively small die sizes. Lens-membrane repositioning may be otherwise achieved. For example, a piezoelectric effect may be employed to achieve repositioning.

Figure 7:
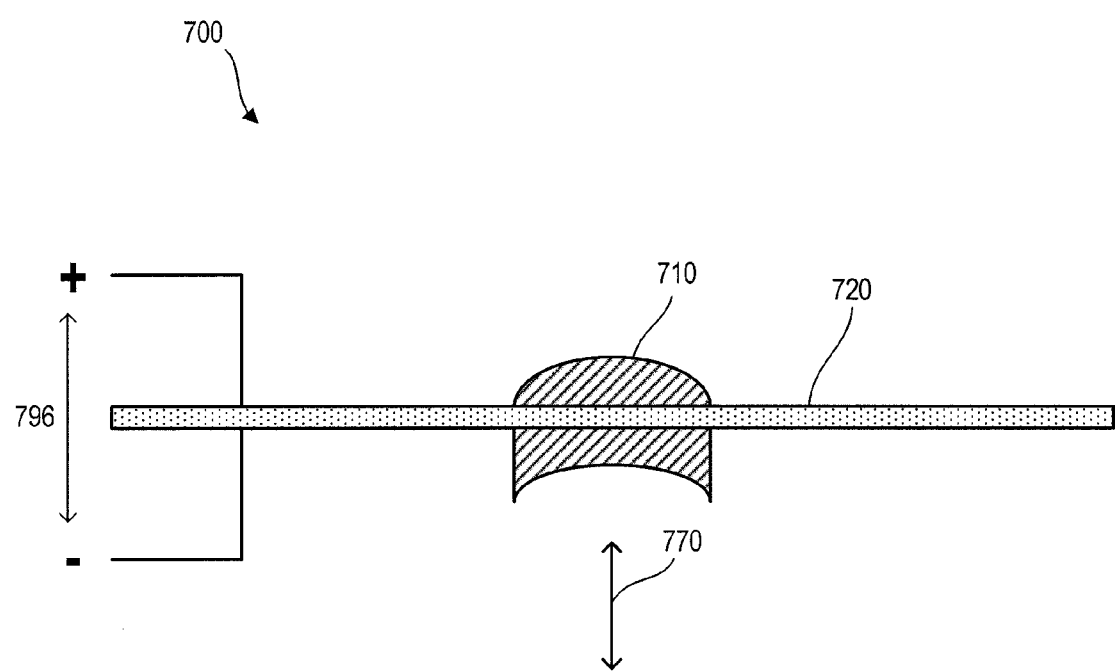
FIG. 7 is a cross sectional view of a membrane and lens assembly, showing repositioning of a membrane-supported lens through a piezoelectric effect, according to an embodiment.

FIG. 7 shows a membrane and lens assembly 700 including a lens/lens group 710 mounted with a membrane 720. Lens group 710 and/or membrane 720 may be made from a piezoelectric material. Applying an electric field, including applying a voltage 796, may cause a piezoelectric effect in lens group 710 and/or membrane 720. For example, piezoelectric-induced tension or relaxation of membrane 720 results in a shape change and/or a displacement (e.g., displacement 770) of membrane 720 and resultant focus adjustment of lens group 710. That is, lens group 710 or membrane 720 itself acts as an actuator to reposition membrane 720 and lens group 710.

Membrane 720 may be made from a variety of materials and/or material combinations, and in a variety of diameters and thicknesses. Mathematical models may be used to design membrane 720 (and other membranes described herein). For example, a finite element model may be created using a 10 micrometer thick membrane 720. Membrane 720's material composition and diameter, along with the motive force acting on membrane 720, may be used to calculate a displacement 770 of membrane 720. In one example, a 12.6 micro-Newton force acting upon a 5 millimeter diameter, 10 micrometer thick rubber membrane results in a 40.0 micrometer membrane displacement. In another example, a 12.6 micro-Newton force acting upon a 4 millimeter diameter, 10 micrometer thick rubber membrane results in a 24.4 micrometer displacement. In yet another example, if a 50.0 micro-Newton force acts upon a 4 millimeter diameter, 10 micrometer thick membrane that is made of Nylon 101 (trade name), then a 3.7 micrometer membrane displacement may occur.

Figure 8:
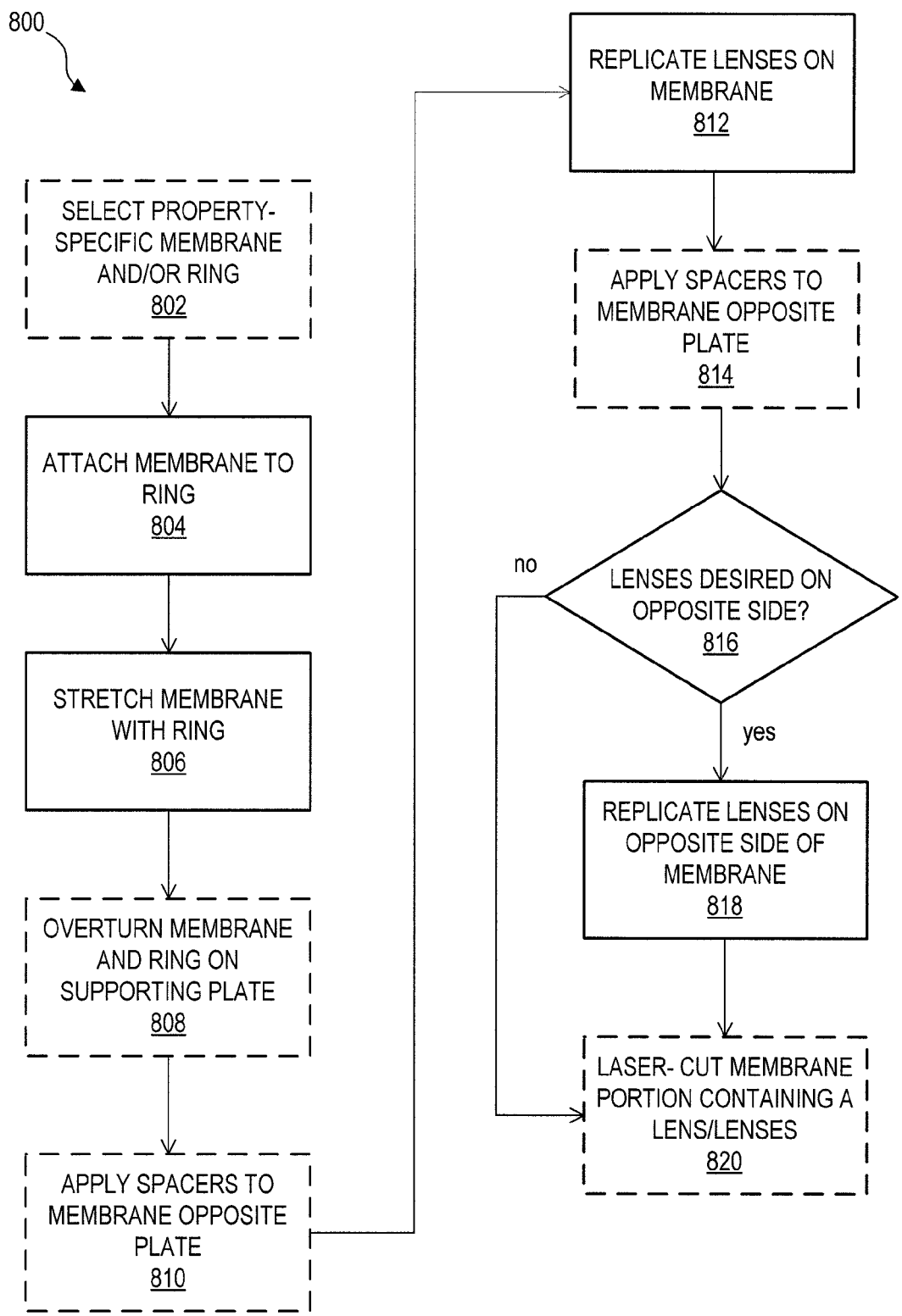
FIG. 8 is a flowchart illustrating a method of lens replication using a flexible membrane.

FIG. 8 illustrates a method 800 of lens replication using a flexible membrane. In optional step 802, a property-specific membrane and/or ring are selected. In one example of step 802, given with respect to FIG. 3A, a material having a relatively low coefficient of thermal expansion (as opposed to the coefficient of thermal expansion of a selected ring, such as ring 340) is chosen for membrane 320. In step 804, the membrane is attached with the ring. In one example, membrane 320, is adhered with ring 340. In particular, membrane 320 may be glued or otherwise affixed with a bottom surface of outer ring 342A (e.g., a surface meant to abut outer ring 342B).

The membrane is stretched by the ring, in step 806. For example, where membrane 320 has a lower coefficient of thermal expansion than ring 340, membrane 320 and ring 340 may be heated to expand ring 340 and stretch attached membrane 320. In another example, one or more bolts 346 are tightened to attach ring element 342A with element 342B, bending element 342A slightly and thereby stretching attached membrane 320 taut.

Optionally, as shown in steps 808 and 810, the membrane and ring may be turned over (i.e., membrane side down) on a supporting plate, and spacers may be applied to the membrane opposite the plate. For example, membrane 320 and ring 340 are turned over onto support plate 350 (FIG. 3D), and spacers 330 are applied. Optionally, if spacers are desired, they may be applied at step 814, following lens replication.

In step 812, lenses are replicated on the membrane. For example, lenses or lens groups 310 are cast or otherwise replicated onto a first side of membrane 320. Lenses or lens groups 310 may be cast in a hexagonal array such as array 202, shown in FIG. 2B. Where spacers are already applied, lenses or lens groups 310 may be cast separately or in arrays between the spacers. Where spacers have not been applied, lenses/groups 310 are cast in a desired array and/or spacing, and spacers are optionally applied in step 814, if desired.

If lenses/lens groups are to be replicated on an opposite side of the membrane (decision 816), lenses/groups are replicated on the opposite side in step 818, for example by turning membrane 320 and ring 340 over. Once lenses are replicated as desired on the membrane, a portion of the membrane containing a lens or lens group may be laser-cut from the membrane, in optional step 820. For example, a membrane and lens assembly similar to membrane 420 and lens group 410; membrane 520 and lens group 510; membrane 620 and lens group 610, or membrane 720 and lens group 710 may be cut from membrane 320.

It will be appreciated that although not specifically detailed above, apertures may be created through the membrane (e.g., membrane 320). For example, an aperture may be machined, photo etched or laser cut beneath an actual or intended center of a lens (e.g., lens 310) to permit light transmission therethrough. In another example, if light sufficiently transmits through the membrane, an aperture may not be required.

Combinations of Features

Features described above as well as those claimed below may be combined in various ways without departing from the scope hereof. The following examples illustrate possible, non-limiting combinations:

(a) A membrane and lens assembly may include a flexible membrane mounted with a supporting structure. At least one first lens may be mounted with a first side of the membrane; and at least one actuator may be operable to vary a characteristic of the membrane, to reposition the lens.

(b) In the membrane and lens assembly denoted as (a), at least one second lens may be mounted with a second side of the membrane, opposite the first side and first lens.

(c) In the membrane and lens assembly denoted as (a) or (b), the supporting structure may be selected from the group of one or more spacers, a frame, a ring, a plate and a surface plate.

(d) In the membrane and lens assembly denoted as (a)-(c), the supporting structure may be a frame forming an opening therethrough for facilitating one or both of barometric equalization and dampening of the membrane.

(e) In the membrane and lens assembly denoted as (a)-(d) Assembly of claim 1, repositioning the lens may adjust focus of the lens relative to a focal plane.

(f) In the membrane and lens assembly denoted as (a)-(e), the supporting structure may include one or more magnetic spacers and the actuator may include at least one coil, wherein an electric current through the coil generates an electromagnetic field for interacting with the magnetic spacers, to attract or repel the membrane.

(g) In the membrane and lens assembly denoted as (a)-(f), the membrane characteristic may be membrane tautness, membrane shape or membrane position. The actuator may include a pair of current-carrying coils, wherein current through each coil generates an electromagnetic field, and wherein interactions between the electromagnetic fields creates a motive force for varying the characteristic.

(h) In the membrane and lens assembly denoted as (a)-(f), the actuator may include a pair of plates that are proximate the membrane and capable of being electrically charged; wherein applying a voltage across the plates generates an electrostatic field for varying one or more of membrane tautness, membrane shape and membrane position, to reposition the lens.

(i) In the membrane and lens assembly denoted as (h), one or more of the membrane, lens, supporting structure and plates may include an electret that facilitates repositioning of the membrane by the electrostatic field.

(j) In the membrane and lens assembly denoted as (a)-(i), the membrane may include one or more piezoelectric materials and the actuator may include a device for applying an electric field proximate the membrane. The electric field for example changes one or both of shape and position of the membrane, to adjust focus of the lens.

(k) In the membrane and lens assembly denoted as (a)-(j), the at least one first lens may be one lens of a lens group mounted with the first side of the membrane.

(l) In the membrane and lens assembly denoted as (a)-(c) or (e), the supporting structure may include a ring having one inner ring element, an upper, outer ring element for mounting with the membrane, and a lower, outer ring element. The actuator may include a set of bolts holding the outer ring elements together such that tightening one or more of the bolts draws the upper ring element towards the lower ring element, to vary one or both of membrane tautness and position.

(m) A membrane and lens assembly may include a flexible membrane mounted with a supporting structure; at least one first lens mounted with a first side of the membrane (one or both of the lens and the membrane including a piezoelectric element), and at least one actuator for inducing a piezoelectric effect in the piezoelectric element of the lens and/or the membrane, to vary one or more of membrane position, lens position, membrane tautness, membrane shape and lens shape, to reposition and adjust focus of the lens relative to a focal plane.

(n) A membrane and lens assembly may include a plurality of supporting magnetic spacers; a flexible membrane mounted with the spacers; a lens mounted with the membrane, and
at least one current-carrying coil. Electric current through the coil generates a magnetic field for interacting with the magnetic spacers to vary one or more membrane characteristics, to reposition and adjust focus of the lens relative to a focal plane.

(o) In the membrane and lens assembly denoted as (n), the membrane characteristics may be membrane position, membrane tautness or membrane shape.

(p) A membrane and lens assembly may include a plurality of supporting spacers; a flexible membrane mounted with the spacers; a lens mounted with the membrane, and a pair of current-carrying coils proximate one another. Current through each coil generates a magnetic field, and interactions between the magnetic fields creates a motive force for varying the membrane characteristics.

(q) A membrane and lens assembly may include a flexible membrane mounted with a supporting structure; a lens mounted with the membrane, and a pair of plates capable of being electrically charged and proximate the membrane. Applying a voltage between the plates generates an electrostatic field for varying a characteristic of the membrane, to adjust focus of the lens relative to a focal plane.

(r) In the membrane and lens assembly denoted as (p), one or more of the membrane, lens and supporting structure may include an electret for facilitating variation of the membrane characteristic by the electrostatic field. The characteristic may be membrane position, membrane shape or membrane tautness.

(s) A method of lens replication may include attaching a flexible membrane to a ring; stretching the membrane with the ring, and replicating lenses on one or both sides of the stretched membrane.

(t) In the method denoted as (s), replicating may include replicating the lenses on the membrane in at least one hexagonal array.

(u) The method denoted as (s) or (t) may further include laser cutting a portion of the membrane that contains a lens.

(v) The method denoted as (s)-(u) may further include, prior to the step of replicating: placing the membrane and ring membrane-side down on a flat surface plate; attaching spacers to the membrane, and following the step of replicating, laser cutting a membrane portion containing a lens from the membrane.

(w) The method denoted as (s)-(w) may additionally include selecting a membrane and a ring such the membrane has a lower coefficient of thermal expansion than the ring. Stretching the membrane may include eating the membrane and the ring such that the ring expands more than the membrane to stretch the membrane, thereby stretching the membrane.

The above description, including the Abstract, and the accompanying drawings are not intended to be exhaustive or to limit the invention to the precise forms disclosed. While specific embodiments of, and examples for, the invention are described herein for illustrative purposes, it should be clear that many changes and modifications may be made to the above-described embodiments without departing from the spirit and scope of this invention. For example, components and methods of manufacture or membrane repositioning described with respect to any above-described membrane assembly may be equally applied to other membrane assemblies described herein, where appropriate.

What is claimed is:

1. A membrane and lens assembly, comprising:
    a flexible membrane mounted with a supporting structure;
    at least one first lens mounted with a first side of the membrane;
    at least one second lens mounted with a second side of the membrane, opposite the first side and the first lens; and
    at least one actuator operable to vary a characteristic of the membrane, to reposition the lens.

2. Assembly of claim 1, the supporting structure selected from the group of one or more spacers, a frame, a ring, a plate and a surface plate.

3. Assembly of claim 1, the supporting structure comprising a frame forming an opening therethrough for facilitating one or both of barometric equalization and dampening of the membrane.

4. Assembly of claim 1, wherein repositioning the lens adjusts focus of the lens relative to a focal plane.

5. Assembly of claim 1, the supporting structure comprising one or more magnetic spacers and the actuator comprising at least one coil, wherein an electric current through the coil generates an electromagnetic field for interacting with the magnetic spacers, to attract or repel the membrane.

6. Assembly of claim 1, the membrane characteristic selected from the group of membrane tautness, membrane shape and membrane position, the actuator comprising a pair of current-carrying coils, wherein current through each coil generates an electromagnetic field, and wherein interactions between the electromagnetic fields creates a motive force for varying the characteristic.

7. Assembly of claim 1, the actuator comprising a pair of plates that are proximate the membrane and capable of being electrically charged; wherein applying a voltage across the plates generates an electrostatic field for varying one or more of membrane tautness, membrane shape and membrane position, to reposition the lens.

8. Assembly of claim 7, one or more of the membrane, lens, supporting structure and plates comprising an electret that facilitates repositioning of the membrane by the electrostatic field.

9. Assembly of claim 1, the membrane comprising one or more piezoelectric materials and the actuator comprising a device for applying an electric field proximate the membrane; wherein the electric field changes one or both of shape and position of the membrane, to adjust focus of the lens.

10. Assembly of claim 1, the at least one first lens comprising one lens of a lens group mounted with the first side of the membrane.

11. A membrane and lens assembly, comprising:
    a flexible membrane mounted with a supporting structure, the supporting structure comprising a ring having:
        one inner ring element,
        an upper, outer ring element for mounting with the membrane, and
        a lower, outer ring element; and
    at least one first lens mounted with a first side of the membrane; and
    at least one actuator operable to vary a characteristic of the membrane, to reposition the lens; wherein the actuator comprises a set of bolts holding the outer ring elements together such that tightening one or more of the bolts draws the upper ring element towards the lower ring element, to vary one or both of membrane tautness and position.

12. A method of lens replication, comprising:
    attaching a flexible membrane to a ring;
    stretching the membrane with the ring, and
    replicating lenses on one or both sides of the stretched membrane.

13. A method of claim 12, wherein replicating comprises replicating the lenses on the membrane in at least one hexagonal array.

14. A method of claim 12, further comprising laser cutting a portion of the membrane that contains a lens.

15. A method of claim 12, further comprising, prior to the step of replicating:
    placing the membrane and ring membrane-side down on a flat surface plate; and
    attaching spacers to the membrane; and
    following the step of replicating, laser cutting a membrane portion containing a lens from the membrane.

16. A method of claim 12, further comprising;
    selecting a membrane and a ring such the membrane has a lower coefficient of thermal expansion than the ring; and
    wherein stretching the membrane comprises heating the membrane and the ring such that the ring expands more than the membrane to stretch the membrane, thereby stretching the membrane.

* * * * *

UNITED STATES PATENT AND TRADEMARK OFFICE
CERTIFICATE OF CORRECTION

PATENT NO. : 8,885,272 B2  
APPLICATION NO. : 13/100039  
DATED : November 11, 2014  
INVENTOR(S) : Penniman Page 1 of 1

It is certified that error appears in the above-identified patent and that said Letters Patent is hereby corrected as shown below:

In the Specification

Column 2, Line 25, "fiat" should read --flat--;
Column 7, Line 6, "$_6N/A^2$" should read --$^6N/A^2$--;

In the Claims

Column 12, Line 29, claim 11, "and" should be deleted.

Signed and Sealed this
Sixteenth Day of June, 2015

Michelle K. Lee
*Director of the United States Patent and Trademark Office*